United States Patent [19]

Seifert

[11] Patent Number: 5,065,582

[45] Date of Patent: Nov. 19, 1991

[54] DEWAR VESSEL FOR A SUPERCONDUCTING MAGNETOMETER DEVICE

[75] Inventor: Heinrich Seifert, Bubenreuth, Fed. Rep. of Germany

[73] Assignee: Siemens Aktiengesellschaft, Berlin & Munich, Fed. Rep. of Germany

[21] Appl. No.: 533,297

[22] Filed: Jun. 5, 1990

[30] Foreign Application Priority Data

Jun. 5, 1989 [DE] Fed. Rep. of Germany ....... 3918330

[51] Int. Cl.$^5$ ................................................. F17C 1/00
[52] U.S. Cl. ...................................... 62/45.1; 62/51.1; 335/216; 505/879; 505/892
[58] Field of Search ................ 62/45.1, 51.1; 335/216; 505/879, 892

[56] References Cited

U.S. PATENT DOCUMENTS

| | | | |
|---|---|---|---|
| 3,012,407 | 12/1961 | Burrows | 62/45.1 |
| 3,118,194 | 1/1964 | Biais | 62/45.1 |
| 3,461,678 | 8/1969 | Klipping et al. | 62/45.1 |
| 4,287,720 | 9/1981 | Barthel | 62/45.1 |
| 4,827,217 | 5/1989 | Paulson | 324/248 |

FOREIGN PATENT DOCUMENTS

| | | |
|---|---|---|
| 0143532 | 6/1985 | European Pat. Off. |
| 0185186 | 6/1986 | European Pat. Off. |
| 0200958 | 12/1986 | European Pat. Off. |
| 0111827 | 4/1987 | European Pat. Off. |
| 3430406 | 3/1985 | Fed. Rep. of Germany |

OTHER PUBLICATIONS

Cryogenics, Jun. 1983, pp. 299–302; J. Phys. E.: Sci. Instrum., vol. 13, 6/1980, pp. 801–813.
IEEE Trans on Electron Devices, vol. Ed-27, No. 10, Oct. 1983, pp. 1896–1908.
Physics Today, Mar. 1986, pp. 36–44; Biomagnetism—Proceedings Third Intl. Workshop on Biomagnetism, Berlin, 6/1980, pp. 3–31.
Rev. Sci. Instrum., vol. 53, No. 12, Dec. 1982, pp. 1815–1845.

*Primary Examiner*—Ronald C. Capossela
*Attorney, Agent, or Firm*—Kenyon & Kenyon

[57] ABSTRACT

Outside of its interior space, a Dewar vessel contains a high-frequency screening device around the superconducting parts of the measuring device. At the same time, the high-frequency screening device is designed as a thermal radiation shield, whereby its surfaces surrounding the superconducting parts are retained at a temperature level which lies between the low temperature of a cryogenic fluid and the outside temperature of the vessel. To suppress eddy currents, the surfaces of the screening device can be advantageously resolved, at least in the area of these superconducting parts, into individual, electrically conductive tracks, which are electrically insulated from each other.

12 Claims, 3 Drawing Sheets

DEWAR VESSEL FOR A SUPERCONDUCTING MAGNETOMETER DEVICE

BACKGROUND OF THE INVENTION

The present invention relates to a Dewar vessel for a device that measures weak magnetic fields produced by at least one field source to be detected. An area of the interior space of this vessel is provided for accommodating the superconducting parts of the measuring device to be cooled by a cryogenic fluid supplied from the outside, and this area is surrounded by a high-frequency (HF) screening device. Such a Dewar vessel is described in EP-A-0 143 532, for example.

The application of superconducting quantum interferometers, so-called "SQUIDs" (abbreviation of "Superconducting QUantum Interference Devices") is generally known for measuring very weak magnetic fields (compare, for example, "J. Phys. E.: Sci. Instrum.", Vol. 13, 1980, pp 801 to 813 or (CANC) "IEEE Trans. Electron Dev.", Vol. ED-27, No. 10, Oct. 1980, pp 1896 to 1908). The preferred areas of application for these interferometers are considered to be the detection of submicroscopic movements of gravitational waves or, in the area of diagnostic medicine, magneto-cardiography or magneto-encephalography (compare, for example, "Physics Today", March 1986, pp 36 to 44). The magnetic fields produced by magnetic heart and brain waves, have field strengths in the order of magnitude of, respectively, only about 50 pT and 0.1 pT (compare, for example, "Biomagnetism—Proceedings Third International Workshop on Biomagnetism", Berlin 1980, pp 3 to 31). One must be able to detect these very weak fields in the presence of relatively large interference fields as well.

Measuring devices are known for measuring these types of magnetic fields, in particular biomagnetic fields, of the mentioned order of magnitude. These measuring devices can have a single-channel or particularly a multi-channel design (compare, for example, EP-B-0 111 827). Depending on the number of channels provided, these devices contain SQUID magnetometers with superconducting gradiometers of a first or higher degree. In the case of a corresponding magnetometer device described in the mentioned literature reference, "Physics Today", its superconducting gradiometers are mounted, together with the SQUIDs assigned to it, inside a Dewar vessel. In this connection, it is necessary to cool the superconducting, built-in components, particularly the highly sensitive SQUIDS, while avoiding direct and indirect magnetic interferences. SQUID systems are extremely sensitive to high-frequency, electromagnetic radiation, which emanates, for example, from broadcast transmitters or mobile radio sets. The interference influence is thereby based on a washing out or blurring of structures in the d.c. characteristics of the SQUIDs. The interference particularly manifests itself in a worsened signal compared to the noise condition, in a misadjustment of an electronic system assigned to the SQUIDs and in an output signal of the measuring device proportional to the interference amplitude and superimposed on the useful signal.

A way to diminish the influence of high-frequency, interference-producing sources consists in operating the entire measuring device in a high-frequency protected or shielded space (compare, for example, "Rev. Sci. Instrum.", vol. 53, no. 12, Dec. 1982, pp 1815 to 1845). Another way is to provide the superconducting parts of the measuring device itself with an external high-frequency screening device. This type of screening is also realized in the case of the Dewar vessel described in the EP-A-0 143 532 mentioned above. The known Dewar vessel contains an essentially hollow-cylindrical, warm outer housing disposed around a cold, likewise hollow-cylindrical inner housing. A vacuum between the outer and inner housing is provided for thermal insulation. A cryogenic fluid is introduced via the neck of the vessel into the interior space of the inner housing in order to keep the superconducting, built-in components of the measuring device mounted there at the required operating temperature. These superconducting, built-in components are screened from the outside by means of a high-frequency shield. This shield is situated on the inner wall of the inner housing and thus, in the area of the built-in components, is likewise kept at the operating temperature of these components. However, it has been shown that, to an extent, these screening measures are not adequate. Thus, for example, when a SQUID system is virtually completely encased by an enclosed metal surface, this leads to thermally dependent eddy currents, which represent magnetic noise sources. On the other hand, if the screening surface were left open in the SQUID area, then it would be exactly the most sensitive location of the entire measuring device which would be left unscreened.

A Dewar vessel for mounting a magnetic-field measuring device having superconducting parts is also described in WO-A-88/07835. In this known device, however, these superconducting parts are only thermally coupled to a coolant bath by means of heat-transmitting elements. This type of direct cooling, however, can cause technical problems related to cooling in the case of a normal-conducting development (quench) of the superconducting parts. A portion of these heat-transmitting elements is formed, in the case of the known device, by parallel-running copper wires, which at the same time serve as a RF-interference shield.

SUMMARY OF THE INVENTION

An object of the present invention is to provide a Dewar vessel of the type mentioned in the beginning to the such that, on the one hand, an effective high-frequency screening of at least the superconducting parts of the measuring device is achieved without any associated increase in noise or any worsening of the signal/-noise ratio and, on the other hand, such that an effective cooling of the superconducting parts of the measuring device is achieved.

The above and other objects of the invention are achieved by a Dewar vessel for a device for measuring weak magnetic fields produced by at least one field source to be detected, the vessel having an area of its interior space for accommodating the superconducting parts of the measuring device to be cooled by a cryogenic fluid to be supplied from the outside, the cryogenic fluid having a low temperature $T_+$, the area being surrounded by a high-frequency (HF) screening device, the high-frequency screening device outside of the interior space between the inner and the outer wall of the Dewar vessel further comprising a thermal radiation shield and operationally at least the surfaces of the high-frequency screening device surrounding the superconducting parts of the measuring device being retained at a temperature level between the low temperature ($T_l$) of the cryogenic fluid and an outside temperature ($T_a$) of the vessel.

The advantages associated with the invention are particularly that with the high-frequency screening, one achieves at the same time an efficient thermal screening of the low-temperature range in a simple way and thus of the superconducting parts of the measuring device.

To suppress eddy currents, it is particularly advantageous for the surfaces of the high-frequency screening device, at least in the area of the superconducting parts of the measuring device, to be divided into individual, electrically conducting tracks or circuit-board conductors which are insulated from each other. This allows the noise caused by the high-frequency screening due to thermally excited eddy currents to be kept accordingly at a minimum.

BRIEF DESCRIPTION OF THE DRAWINGS

The invention will be described in greater detail in the following detailed description with reference to the drawings, in which.

DETAILED DESCRIPTION

SQUID magnetometers, as they can be provided for single-channel or particularly for multi-channel measuring devices, are known in principle. They contain at least one superconducting gradiometer for detecting the magnetic signals (magnetic fluxes or flux gradients) emanating from a biomagnetic field source, particularly from the heart or from the brain of a patient. The gradiometer coils can thereby be advantageously combined to form arrays. The detected signals are then fed via superconducting or normal-conducting connecting conduits to a number of SQUIDs corresponding to the channel number. An external electronic system is connected on the load side to these SQUIDs, which likewise can be combined to form an array. No further details of these parts, which are known per se, are shown in the figures.

Figure 1:
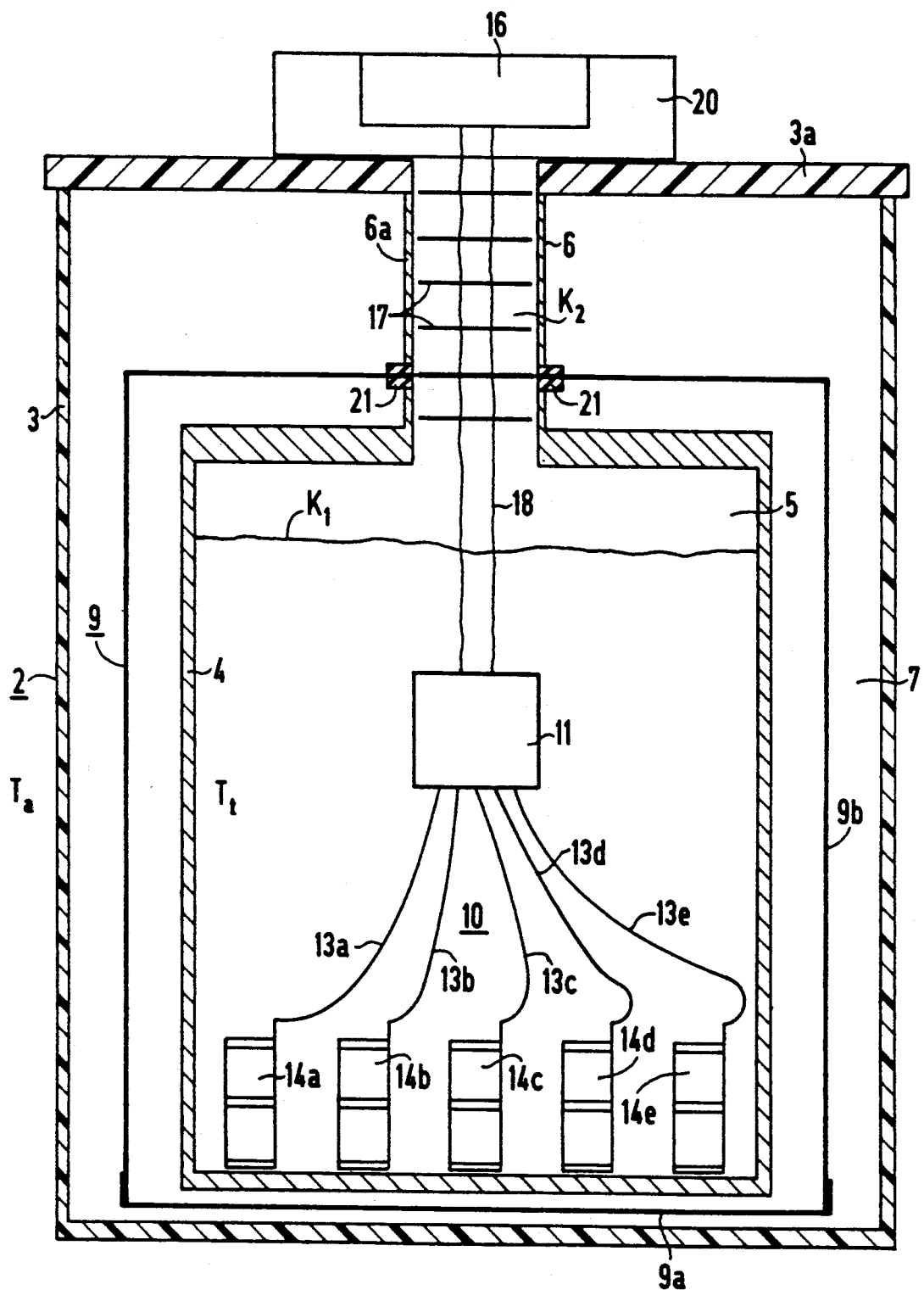
FIG. 1 shows a section through a Dewar vessel according to the invention with a high-frequency screening device.

According to the schematically depicted longitudinal section in FIG. 1, a Dewar vessel 2 with an at least substantially dynamically balanced design is provided for accommodating the superconducting parts of such a measuring device (magnetometer). The vessel is designed in a well-known manner to be double-walled; that is it comprises an outer wall 3 lying at an outside temperature $T_a$ and an inner wall 4 that the outer wall 3 encircles. The interior space 5 of the vessel defined by the inner wall 4 allows for access via a relatively narrow neck 6. In a well known way, the clearance space 7 between the walls 3 and 4 of the vessel is evacuated and optionally contains a super insulation not depicted in the figure. A high-frequency screening device 9, designed according to the invention, is to be mounted in this clearance space, thus outside of the inner space 5. To facilitate the assembly of this device, the annular upper part 3a of the outer wall 3 or of the vessel 2 can be designed so that they are able to be disassembled. The screening device advantageously surrounds the inner space 5 on all sides, quasi as a high-frequency sealed Faraday cage and, at the same time, is designed as a thermal radiation shield.

The quantity of liquid cryogen $K_1$, generally liquid helium, required for one work period, for example one work day, is introduced into the inner space 5 of the Dewar vessel 2 and thus lies at a corresponding low temperature $T_t$. This cryogenic fluid either directly or indirectly cools the superconducting parts of the measuring device which are generally denoted with 10. The SQUIDs of this measuring device, which are not depicted in the figure and which are advantageously combined to form an array, are thereby situated on a chip 11 that is only shown symbolically. The SQUIDs are connected, for example, via superconducting connecting conduits 12a to 12e to corresponding superconducting gradiometers. Of these gradiometers, only five are indicated in the figure and are denoted with 14a to 14e. Their number, however, can lie considerably above this. The SQUIDs on the chip 11 are connected to the outside via connecting leads to an external electronic system 16. These lines also extend thereby through the neck 6, where they pass through several radiation shield plates 17, which are known per se and are set apart from each other (compare, for example, EP-A-0 200 958). These radiation shield plates mostly obstruct the exposed cross-section of the neck 6, that is the cross-section that is free of built-in components. However, they leave open a sufficient flow-through cross-section for exhaust gas $K_2$ of the liquid cryogen $K_1$ situated in the inner space 5 to escape to the outside. This exhaust gas $K_2$ is provided in the neck region not only for cooling the radiation shield plates, but also for cooling the connecting leads between the SQUID chip 11 and the external electronic system 16. The connecting leads, in the same way as the connecting lines 12a to 12e, can be advantageously designed in a well-known way as so-called foil conductors (compare for example the EP-A-0 185 186). In the figure, only the foil of the connecting leads is sketched and denoted with 18. A part of the external electronic system 16 connected to the supply leads can be optionally integrated in a lid part 20, which is used to cover the Dewar vessel 2 at the opening of its neck 6.

The liquid cryogen $K_1$ is refilled from above into the interior space 5 of the Dewar vessel 2 through the neck 6, for example, via a tubing not depicted in the figure. This tubing extends through the radiation shield plates 17 and forms a vacuum-insulated connection to an external supply vessel (not depicted), which connection is cooled in the reverse current with the exhaust gas $K_2$ of the cryogenic fluid. The refilling can thereby take place repeatedly, for example daily.

According to the invention, the high-frequency screening device 9 also acts as a thermal radiation shield. To this end, it should consist of a material with good thermal conducting properties, such as copper. The metal can thereby also be applied to an electrically insulating carrier, for example one made of plastic. This radiation shield surrounds, with the inclusion of the radiation shield plates 17 situated in the area of the neck 6, the entire low-temperature range, i.e., the interior space 5. It is generally composed of several pieces. Thus, for example, according to the depicted exemplified embodiment, it is assumed that it shows a more or less pot-like base part 9a, which is high-frequency conductively connected, for example hard-soldered or bonded, to a hollow-cylindrical side part 9b. The screening device is expediently cooled by the discharge gas $K_2$ of the cryogenic fluid $K_1$ to about 100 K, for example. For this purpose, it can be thermally coupled to one or several of the radiation shield plates 17. According to the exemplified embodiment depicted in the figure, it is assumed that a galvanic (electric) and thermal connection to one radiation shield 17 exists via at least one lead-in wire 21 in the neck wall 6a.

Since an adequate high-frequency screening effect should be guaranteed with this radiation shield at the same time, it must first of all be designed to be high-frequency conductive all the way through, that is sufficiently high-frequency sealed. This is accomplished, according to the depicted specific embodiment, at the Dewar neck 6, where the thermal coupling to the discharge gas $K_2$ takes place by means of a galvanic or capacitive connection to the radiation shield plates 17, which assume the task of screening inside the Dewar opening. This results in a virtually completely enclosed screening shell around the high-frequency sensitive, superconducting parts 10 of the measuring device. Secondly, in order to have an effective high-frequency screening, the radiation shield, particularly in the area of the superconducting parts 10 of the measuring device, must be designed in a way which will not allow any thermally excited eddy currents to flow in it. To this end, its metallic coating must have an interrupted form. This means that the surface of the high-frequency screening device 9, at least in this area, must be resolved into individual, electrically conductive tracks, which are electrically insulated from each other. At these locations, where a galvanic connection is not possible due to the requirement that thermal eddy currents must be avoided, a capacitive and thus a high-frequency effective coupling is produced by means of an overlapping or a cross-wise layering of metallic tracks.

Figure 2:
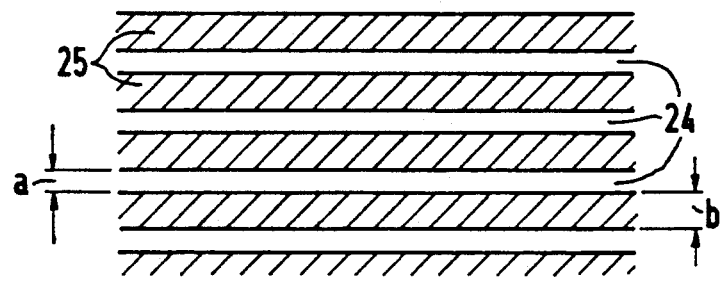
FIGS. 2 and 3 show the high-frequency screening device of FIG. 1 in greater detail.
Figure 3:
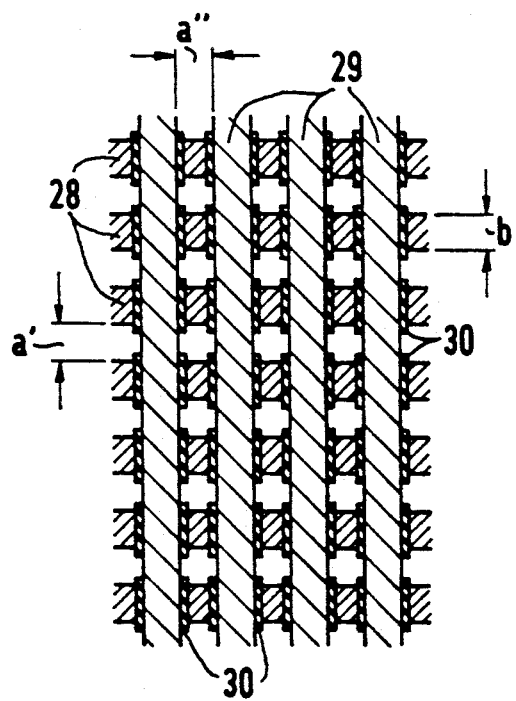

Two corresponding refinements of a high-frequency screening device proceed from FIGS. 2 and 3, each showing schematically a cutaway portion of the device in a top view.

According to FIG. 2, for example, individual strip lines 25 made of material with good electrically and thermally conducting properties such as Cu are applied as conducting tracks, for example pasted on an electrically insulating carrier 24, for example, a plastic foil. The strip lines 25 can also be worked out, for example etched out of a foil coated with Cu. To ensure the necessary suppression of eddy currents, the width b of the strip lines 25 should generally amount to 2 mm at the most. Conductor widths b of between 0.5 mm and 1.5 mm have proven to be advantageous. The strip lines 25 extend, lying parallel to each other, whereby their mutual clearance a is expediently selected to be between 1 and 2 mm. Generally a lies in the order of magnitude of the conductor widths b.

In place of the strip lines 25 depicted in FIG. 2 which have a band shape, wire-shaped conductors with a circular cross-section can be provided, for example, as conducting tracks. In this case, the circle diameter of these conductors is to be selected in the order of magnitude of the conductor width b.

Outside the area of the superconducting parts 10 of the measuring device, the high-frequency screening device 9 does not necessarily need to be subdivided into individual conductor parts. It can also be optionally formed there by an enclosed surface, since in this part of the screening device possibly induced eddy currents are virtually not able to be coupled to the superconducting parts 10 of the measuring device, particularly not to the SQUIDs. Therefore, the strip lines 25 can be connected, for example hard-soldered, at their ends in an electrically conductive fashion to these surfaces. However, in this case as well, only a capacitive connection is possible between the strip lines and the surface.

Instead of resolving the surface of the high-frequency screening device 9 into individual strip lines 25 lying parallel to each other, according to FIG. 2, netlike structures or tissue or netting with rectangular or with rhombic or also ring-shaped meshes can also be provided to screen the superconducting part 10 of the measuring device. In the nodes or overlapping areas of these, for instance, net-type structures, however, generally a reciprocal electrical insulation of the individual conductor parts must be ensured.

A corresponding exemplified embodiment of this type of high-frequency screening device is sketched in FIG. 3. Its net-type structure, which is generally designated with 27, is formed by strip lines 28 and 29, whereby the strip lines 28 running parallel to each other cross at right angles the strip lines 29 likewise running parallel to each other. In the intersection areas, the strip lines 28 are electrically separated from the strip lines 29, for example, by individual, thin, insulation surface elements 30. These insulation surface elements can optionally form an enclosed insulation layer as well, so that the strip lines 28 and 29 then come to lie in the planes separated by the insulation layer. Furthermore, it is also possible to construct the net-type structure 27 out of strip lines or wires, whereby this net-type structure is then itself insulated by an enamel. Since one strives to suppress eddy currents, a mesh width is selected for the net-type structure in the order of magnitude of the clearance a according to FIG. 2. This means that the clearances a' and a" between the strip lines 28, respectively 29, advantageously lie between 1 and 2 mm.

Figure 4:
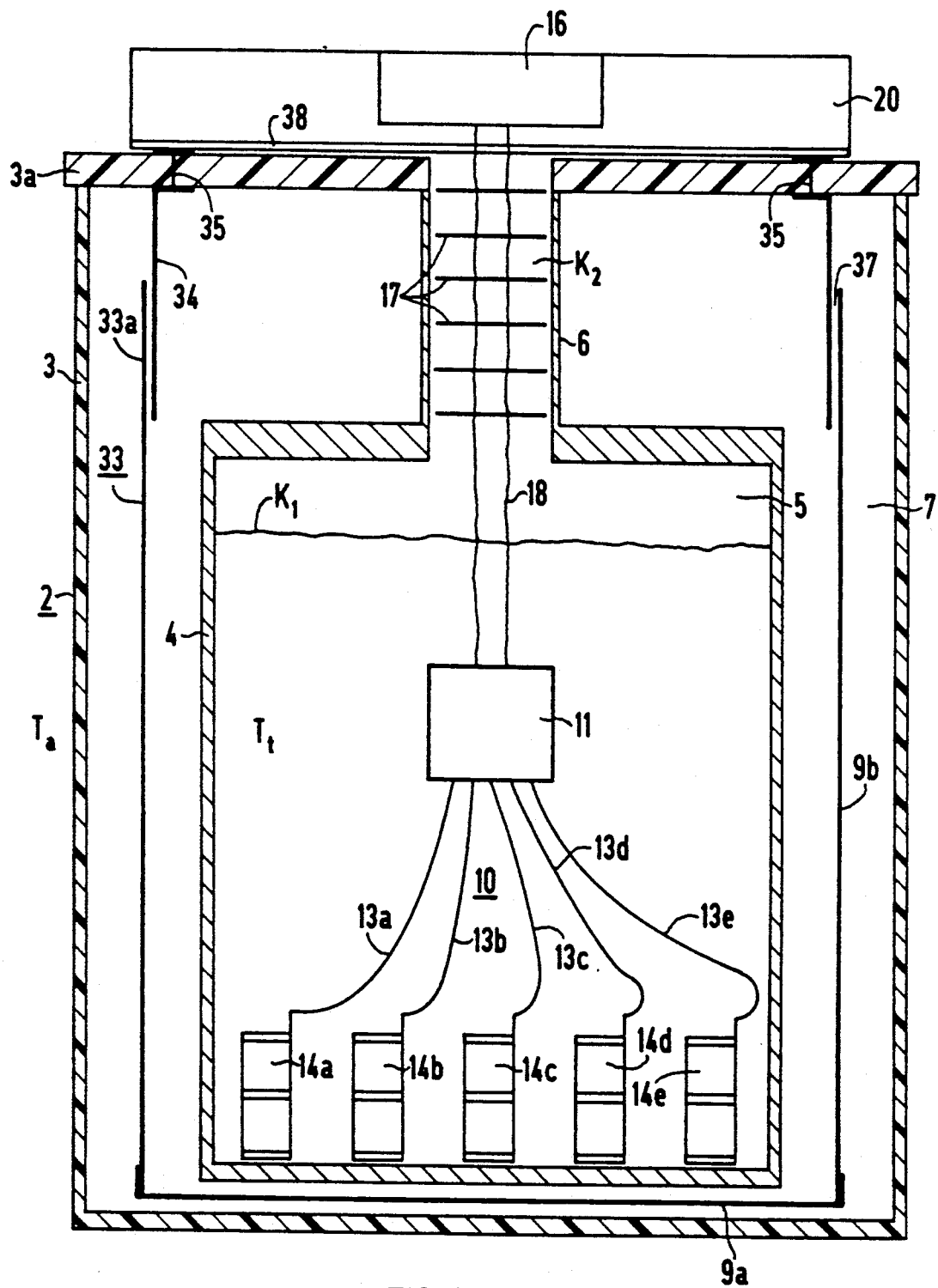
FIG. 4 shows a further construction possibility for a high-frequency screening device. Corresponding parts in the figures are thereby provided with the same reference symbols.

In the case of the exemplified embodiment of a high-frequency screening device 9 according to the invention depicted in FIG. 1, one starts from the assumption that this device is thermally and electrically coupled directly to one of the radiation shield plates 17 in the area of the neck 6 and thus lies more or less at the temperature level of this plate. For this purpose, the lead-in wires 21 which pass through the neck wall 6a are necessary. However, if one wants to do without such lead-in wires, it is also possible to have an enclosed high-frequency screening above the lid part 20. A corresponding exemplified embodiment is schematically depicted in the longitudinal section of FIG. 4. The high-frequency screening device generally designated with 33 is formed in the area of the superconducting parts 10 of the measuring device according to the device 9 of FIGS. 1 to 3. Instead of the connection to one of the radiation shielding plates 17 in the neck area of the Dewar vessel, the screening device 33 ends however in the neck area in a hollow-cylindrical end piece 33a. This end piece concentrically surrounds a likewise hollow-cylindrical screening part 34, which is connected, for example, to a ring-shaped, electrical lead-in wire through the upper part 3a of the Dewar vessel 2, which upper part is able to be disassembled. Between the end piece 33a and the screening part 34, a narrow annular clearance 37 is thereby left open, so that only a capacitive coupling exists between these parts 33a and 34. Then, the opening of the bushing or entrance 35 and thus the area of the neck 6 must be high-frequency sealed by means of an electrically conductive surface 38 on the bottom side of the lid part 20. This specific embodiment of the high-frequency screening device is cooled, for example, by means of a radiation interchange with the environment.

If such a design-dependent, only weakly thermal coupling is not desired, then of course it is possible, in the case of all specific embodiments of a high-frequency device according to the invention mounted in a Dewar vessel, to cool directly by means of exhaust gas, for example, via special cooling lines near the high-frequency device. In doing this, measures must also be provided for suppressing eddy currents. Optionally, some of the discrete conducting tracks of the device can even be designed as tubular cooling lines for the discharge gas.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A high-frequency screening device surrounding an interior space of a Dewar vessel that contains a device for measuring weak magnetic fields produced by at least one field source to be detected, the vessel having a neck and an area of the interior space for accommodating superconducting parts of the measuring device to be cooled by contacting a cryogenic fluid to be supplied from outside the vessel via the neck, the cryogenic fluid having a low temperature, said screening device comprising:

at least one surface that surrounds the area of the vessel accommodating the superconducting parts of the measuring device that is formed by individual, electrically conducting tracks which are electrically insulated from one another to suppress eddy currents, said screening device disposed outside of the interior space between an inner and outer wall of the Dewar vessel and acting as a thermal radiation shield, whereby said at least one surface of the high-frequency screening device surrounding the superconducting parts of the measuring device is maintained at a temperature level between the low temperature of the cryogenic fluid and an outside temperature of the vessel.

2. The device recited in claim 1, wherein said conducting tracks are formed by wire conductors.

3. The device recited in claim 1, wherein the conducting tracks form a net-type structure, said conducting tracks being insulated from one another at crossover points.

4. The device recited in claim 1, wherein the conducting tracks have a width no greater than 2 mm.

5. The device recited in claim 1, wherein a clearance space between parallel and adjacent pairs of the conducting tracks is no greater than 2 mm.

6. The device recited in claim 1 wherein the Dewar vessel further comprises at least one radiation shielding plate disposed in the neck and substantially obstructing a cross-section thereof, said shielding plate being cooled by a discharge gas of the cryogenic fluid.

7. The device recited in claim 6 wherein said screening device includes a top part coupled to one of the radiation shielding plates.

8. The device recited in claim 1 wherein said conducting tracks are formed by band-shaped conductors.

9. The device recited in claim 1 wherein said conducting tracks are formed by strip-shaped conductors.

10. The device recited in claim 1, wherein the conducting tracks have a width between 0.5 and 1.5 mm.

11. The device of claim 1 wherein the vessel has side walls and a lid part covering the neck and said device further includes a screening part surrounding the neck and coupled to an electrically conductive surface on a bottom side of the lid part of the Dewar vessel providing high frequency sealing of the neck, said screening part capacitively coupled to an end piece of the side walls of the vessel.

12. The device recited in claim 11 wherein the end piece of the side wall of the Dewar vessel concentrically surrounds the screening part.

* * * * *